April 3, 1962 E. S. TELTSCHER ET AL 3,028,509

TRANSISTORIZED WAVE SHAPE CONVERTER

Filed June 2, 1959 2 Sheets-Sheet 1

April 3, 1962 E. S. TELTSCHER ETAL 3,028,509

TRANSISTORIZED WAVE SHAPE CONVERTER

Filed June 2, 1959 2 Sheets-Sheet 2

INVENTORS
ERWIN S. TELTSCHER
CONSTANTINE G. VALAVANIS
BY
Borst and Borst ATTORNEYS United States Patent Office 3,028,509

Patented Apr. 3, 1962

3,028,509

TRANSISTORIZED WAVE SHAPE CONVERTER

Erwin S. Teltscher, Forest Hills, and Constantine G. Valavanis, Brooklyn, N.Y., assignors to Sperry Rand Corporation, Ford Instrument Company Division, Wilmington, Del., a corporation of Delaware Filed June 2, 1959, Ser. No. 817,674

2 Claims. (Cl. 307—88.5)

This invention refers to a transistorized switching circuit and particularly to a switching circuit which can be employed to convert an amplitude modulated sine wave signal at a high impedance level to a rectangular output at a low impedance level.

Circuits which are capable of converting sine wave signals to rectangular output signals are known but are characterized as being circuits which are high power dissipating and as having uncertain reliability. The instant circuit does not have these disadvantages primarily because they employ transistors instead of the usual magnetic amplifiers, relays, photoelectric cells and other components which require the provision of a regulated power supply. The instant circuit does not require a regulated power supply and employs transistors stabilized by zener diodes which are components of relatively small size and weight. According to the invention, zener diodes are employed to D.C. couple a series of transistor amplifiers having limiter and integrating circuits disposed respectively in their coupling connections which in conjunction with additional sources of amplification enable the entire network to be operative as to modulated sine wave to rectangular wave converter. Beside their use as D.C. couplers, the zener diodes operate to stabilize the voltages on the electrodes of the transistors so that small signals can be fully amplified independently of power supply variations and transistor leakage currents. The transistors being low input impedance devices the impedance level of the rectangular wave shaped output is low relative to the impedance level of the signal impressed on the input side of the circuit.

One object of the invention is to provide an efficient and low power dissipating relay circuit capable of converting amplitude modulated sine wave signals to rectangular output signals.

Figure 1:
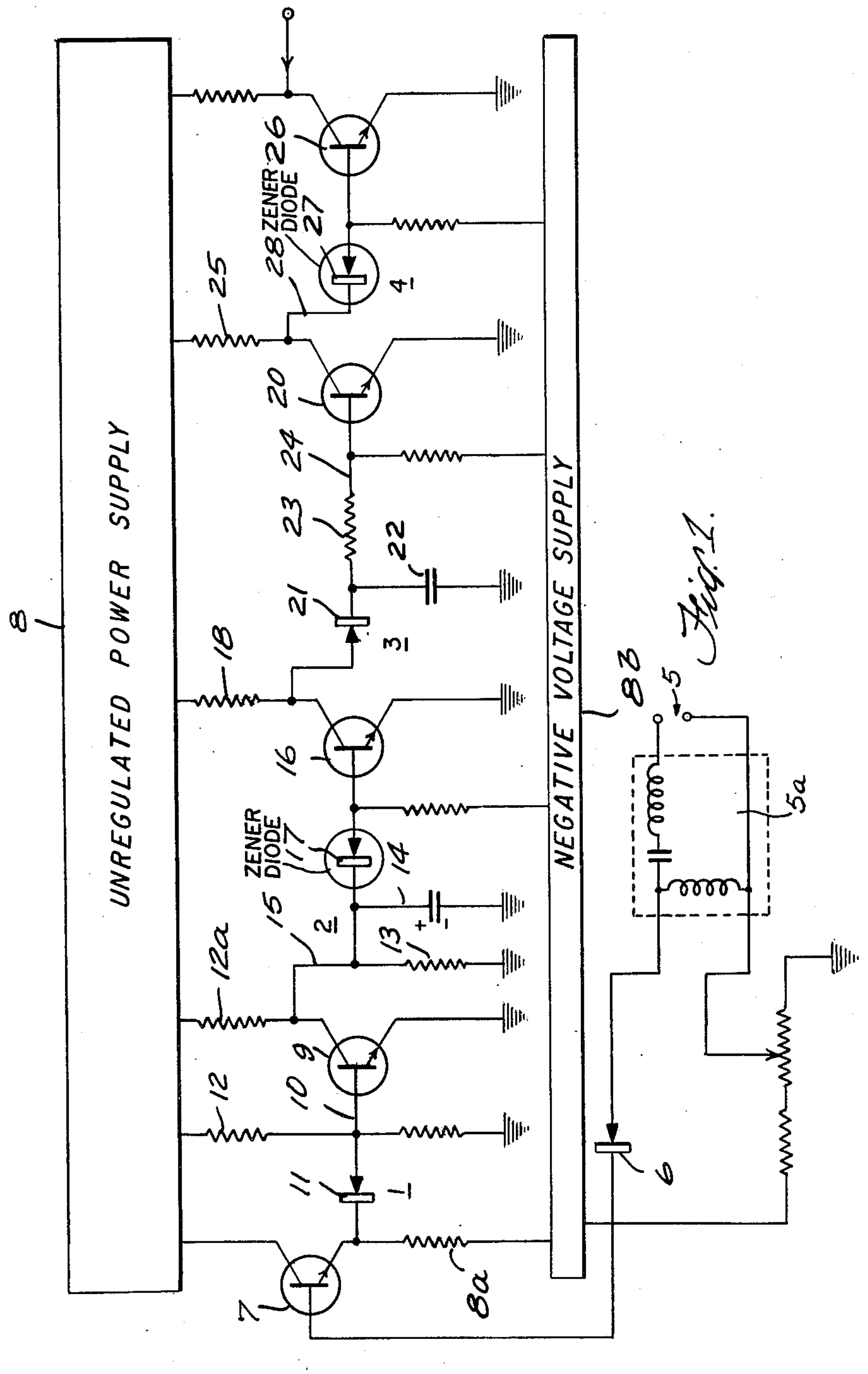
Figure 2:
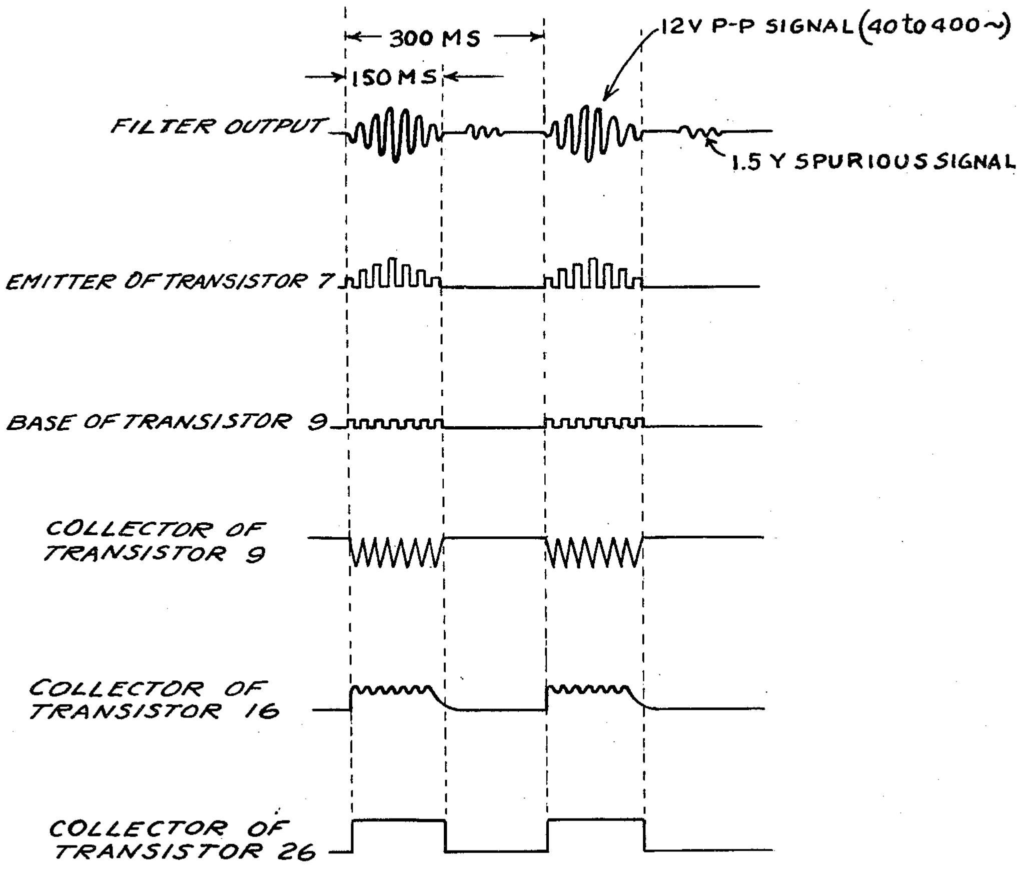

Other objects and advantages of the invention may be appreciated on reading the following description which is taken in conjunction with the accompanying drawings, in which FIG. 1 is a schematic of the control selector transistor switching circuit, and FIG. 2 illustrates the wave forms of the signal as it passes through the circuit.

Referring to FIG. 1, there is provided an input circuit 5 connected to a conventional band pass filter 5*a* and a half wave rectifier 6 disposed between the filter output and the base electrode of a transistor 7, the collector of which is coupled to an unregulated power supply 8. The emitter of the transistor 7 which functions to minimize loading of the filter 5*a* is biased by resistor 8*a* which is energized by a negative voltage source 8*b*, to a point such that voltage sensing occurs approximately half way between the positive peaks of the input signal and the positive peaks of the spurious wave forms impressed thereon as shown in FIG. 2. This signal is placed on the base electrode of transistor 9 by conductor 10 in which there is disposed a base stabilizing diode 11 and to which there is connected a voltage dividing circuit 12 supplied by the unregulated power source 8. Switch 1 of the converter which includes the resistor 12, the base stabilizing diode 11 and the transistor 7 constitutes a limiter circuit which serves to transform the voltage variations in the input to current variations. Since the transistor 7 will not conduct unless its base is more positive than the bias voltage supplied by the resistor 12 to its emitter, only that portion of the signal applied to the base resulting in transistor conductivity will be passed by the limiter circuit. The transistor 9 has a grounded emitter and its collector is supplied by the unregulated power source 8 through resistor 12*a*. The base electrode of the transistor 9 receives signal from the limiter circuit. The wave forms of the signal at the emitter of transistor 7 and the base of transistor 9 are shown in FIG. 2. An integrating circuit comprising resistor 13 and capacitor 14 receive the output of the transistor 9 on the conductor 15 which couples the transistor 9 to transistor 16 through zener diode 17. Switch 2 comprising the transistor 9, the integrating circuit composed of the resistor 13, the capacitor 14, and the zener diode 17 serves to amplify and integrate the signal applied to the base electrode of the transistor 9. In the second wave form diagram of FIG. 2 there is shown the integrated wave form of the signal on the collector of the transistor 9.

The unregulated supply 8 supplies the collector electrode of the transistor 16 through resistor 18 and the emitter of this transistor is grounded. The collector output of the transistor 16 is coupled to the transistor 20 through half wave rectifier 21 and an integrating circuit comprising a capacitor 22 and resistor 23 disposed in the coupling lead 24 for the two transistors. The wave form of this current in the output of the transistor 16 is shown in FIG. 2. The transistor 16 like the transistor 9 thus functions as an amplifier on the input side of an integrating circuit and the transistor 16, half wave rectifier 21 and the integrating circuit comprising the capacitor 22 and the resistor 23 constituting switch 3 of the converter which serves to further amplify and integrate the signal.

The unregulated power supply 8 supplies the collector of the amplifier transistor 20 through the resistor 25, the emitter electrode for the transistor 20 being grounded.

An additional amplification stage is provided by the transistor 26 which is its sole function, the base electrode of which is coupled to the collector of the transistor 20 through zener diode 27 provided in the coupling conductor 28. The zener diode 27 will prevent the signal from being applied to the amplifying resistor 26 unless the signal applied to its cathode is such that the relative potential between the cathode and anode of the zener diode exceeds the zener threshold voltage required for its conduction. Switch 4 of the converter which includes the transistor 20, the zener diode 27 and the transistor 26, constitutes its final amplifying switch. Since the zener diode is used both for D.C. coupling and base collector voltage stabilization, small signals are permitted to be fully amplified independently of power supply variations and transistor leakage currents. The rectangle wave shape in the output of the transistor 26 is also shown in FIG. 2.

It is seen that the zener diodes are used for two purposes, namely, D.C. coupling and base and collector voltage stabilization. The transistorized circuit which is stabilized in this manner, permits small signals to be fully amplified independently of power supply variations and transistor leakage currents.

Various modifications of the invention may be effected by persons skilled in the art without necessarily departing from the principle and scope of the invention as defined in the appended claims.

What is claimed is:

1. A transistorized wave shape converter comprising an input transistor, an input circuit connected to said input transistor having means for controlling the average value of a sine wave signal which is impressed thereon, a second transistor, a base stabilizing diode coupling said input transistor and said second transistor, an integrating network disposed in the output of said second transistor, a third transistor, a zener diode coupling said second transistor to said third transistor, a second integrating network disposed in the output of said third transistor, an amplifying circuit connected to the output of said second integrating network and power and voltage supply means for biasing said transistors and said zener diodes.

2. A transistorized wave shape converter as claimed in claim 1 wherein said amplifying circuit comprises a pair of transistors and a zener diode coupling said transistors, said zener diodes permitting small signals to be amplified independently of power supply variations and transistor leakage currents and said integrating networks and said amplifier circuits serving to yield a rectangular wave form in the output of said amplifying circuit when a sine wave is impressed on said input transistor.

References Cited in the file of this patent

UNITED STATES PATENTS

| | | |
|---|---|---|
| 2,947,916 | Beck | Aug. 2, 1960 |
| 2,975,364 | Fleming | Mar. 14, 1961 |